(12) United States Patent
Hoshino et al.

(10) Patent No.: US 7,254,301 B2
(45) Date of Patent: Aug. 7, 2007

(54) OPTICAL MODULE

(75) Inventors: Yasuji Hoshino, Hamamatsu (JP);
Takashi Iida, Hamamatsu (JP);
Yoshihisa Warashina, Hamamatsu (JP);
Kei Tabata, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 0 days.

(21) Appl. No.: 10/546,187

(22) PCT Filed: Feb. 19, 2004

(86) PCT No.: PCT/JP2004/001926

§ 371 (c)(1),
(2), (4) Date: Jun. 5, 2006

(87) PCT Pub. No.: WO2004/074896

PCT Pub. Date: Feb. 9, 2004

(65) Prior Publication Data

US 2006/0233497 A1    Oct. 19, 2006

(30) Foreign Application Priority Data

Feb. 19, 2003    (JP) .............................. 2003-041472

(51) Int. Cl.
*G02B 6/26* (2006.01)
(52) U.S. Cl. ..................... 385/52; 385/14; 385/49; 385/88; 385/89; 385/94; 385/93; 385/137
(58) Field of Classification Search .................. 385/89, 385/92, 88, 93, 94, 137, 14, 52, 49
See application file for complete search history.

(56) References Cited

U.S. PATENT DOCUMENTS

| 4,897,711 A | | 1/1990 | Blonder et al. ........... 385/92 X |
| 5,071,213 A | * | 12/1991 | Chan .......................... 385/52 |
| 5,671,315 A | * | 9/1997 | Tabuchi et al. ............. 385/137 |
| 6,132,107 A | | 10/2000 | Morikawa ..................... 385/89 |
| 6,160,936 A | * | 12/2000 | You et al. ..................... 385/49 |

(Continued)

FOREIGN PATENT DOCUMENTS

JP    01-183606    7/1989

(Continued)

OTHER PUBLICATIONS

S. Uchiyama et al. "Passive-alignment 980nm VCSEL array module." Technical Report of IEICE. LQE 99-130 (Feb. 2000), pp. 1-6, and English language translation.

*Primary Examiner*—Brian M. Healy
(74) *Attorney, Agent, or Firm*—Drinker Biddle & Reath LLP

(57) ABSTRACT

An optical module comprises: a sub-mount 1, having four photodiodes 12 and two guide grooves 10 disposed on an optical element mounting surface 16; a fiber fixing member 2, having four V-grooves 21, four concave mirrors 22, and two guide rails 20 disposed on an optical fiber fixing surface 26; and four optical fibers 3, fixed to the fiber fixing member 2. With this optical module, the sub-mount 1 and fiber fixing member 2 are aligned and fixed by the fitting together of the guide grooves 10 and guide rails 20. A passive alignment type optical module that enables mass production and cost reduction is thus realized.

21 Claims, 6 Drawing Sheets

U.S. PATENT DOCUMENTS

| | | | |
|---|---|---|---|
| 6,250,820 B1 | 6/2001 | Melchior et al. | 385/89 |
| 6,270,263 B1 | 8/2001 | Iwase et al. | 385/92 |
| 6,377,385 B1 | 4/2002 | Saito | 359/248 |
| 6,504,107 B1 * | 1/2003 | Kragl | 174/260 |
| 6,934,429 B2 * | 8/2005 | Kikuchi et al. | 385/14 |

FOREIGN PATENT DOCUMENTS

| | | | |
|---|---|---|---|
| JP | 2-9183 | 1/1990 | 385/52 X |
| JP | 07-077634 | 3/1995 | |
| JP | 07-151940 | 6/1995 | |
| JP | 07-301729 | 11/1995 | |
| JP | 10-104473 | 4/1998 | 385/52 X |
| JP | 10-206698 | 8/1998 | 385/52 X |
| JP | 2000-33545 | 2/2000 | 385/52 X |
| JP | 2000-275472 | 10/2000 | |
| JP | 2001-513216 | 8/2001 | 385/52 X |

\* cited by examiner

OPTICAL TRANSMITTING DIRECTION

OPTICAL MODULE

TECHNICAL FIELD

The present invention relates to an optical module, wherein an optical fiber and an optical semiconductor element are connected optically.

BACKGROUND ART

With the improvement and expansion of backbone infrastructure in recent years, the focus of attention in the optical communication market is being directed to the furnishing of user line equipment and equipment for connecting user lines with the backbone. Specifically, enhancement of metro area networks, access systems, and school and company LANs and higher speeds and greater capacities in provider's servers and routers are being desired.

In particular, optical connections in a school or company LAN or among servers, routers, etc., within a provider are called VSR (Very Short Reach) or interconnections. Although being short in distance, signal transmissions of high speed and high volume are desired of such optical connections. Since low cost is also desired, expensive equipment, such as that required for optical connection at a transmission rate of 10 Gbps, is not suitable even if it enables high speed.

Due to such demands, optical modules for performing parallel transmission of optical signals at a maximum rate of approximately 2.5 Gbps are being noted. With such an optical module, a tape fiber, which is an optical fiber array, and an optical semiconductor element array are aligned and connected to transmit a plurality of optical signals in parallel. However, if the alignment is performed by fiber alignment, a low-cost optical module cannot be realized. Optical modules, with which alignment is carried out by passive alignment, have thus been proposed (Japanese Patent Application Laid-Open No. H7-77634, Japanese Patent Application Laid-Open No. H7-151940).

FIG. 7 is a sectional view showing an arrangement example of a conventional passive alignment type optical module (see the document, "IEICE Technical Report LQE99–130, pp. 1–6"). The alignment of an optical fiber 92 and an optical semiconductor element 94 is carried out by the insertion and adhesion of guide pins 95, provided in a fiber ferrule 91, into guide pin insertion holes 96 provided in a substrate 93. Here, the optical fiber 92 is inserted in a fiber insertion portion that is aligned with respect to the guide pins 95 and optical semiconductor element 94 is aligned and fixed on the substrate 93 using an aligning mark, formed by the same mask process as the guide pin insertion holes 96, as a guide.

DISCLOSURE OF THE INVENTION

With all optical modules of the conventional passive alignment type, the mounting of the optical fiber is performed at an early stage of the assembly process of the entire optical module. For example, with the optical module shown in FIG. 7, in the case where the substrate 93 is to be mounted onto a circuit substrate as a sub-mount, the substrate 93 is fixed upon being erected perpendicular to the circuit substrate for suppressing the module height. In this case, it will be difficult to mount the fiber ferrule 91 to the substrate 93 after the substrate 93 has been fixed to the circuit substrate. The mounting of the fiber ferrule 91, with the optical fiber 92, onto the substrate 93, with the optical semiconductor element 94, is thus performed prior to the step of fixing the substrate 93 to the circuit substrate.

When such a step of mounting the optical fiber is carried out at an early stage of assembling the entire optical module, handling and automation in subsequent steps may be hindered. For example, in a step wherein the optical semiconductor element or the substrate provided with the optical semiconductor element is to be die-bonded or wire-bonded, etc., to the circuit substrate, a specialized device that takes into consideration that the optical fiber has been mounted already will be required. Such situations have hindered mass production and cost reduction of optical modules.

The present invention has been made to resolve the above issues, and an object thereof is to provide an optical module suitable for mass production and cost reduction.

In order to achieve the above object, the present invention's optical module comprises: (1) a sub-mount, having an optical semiconductor element, disposed on a predetermined first surface, and a first alignment portion, which is formed on the first surface; (2) a fiber fixing member, having a fixing groove, which is formed on a predetermined second surface and is for aligning and fixing an optical fiber, a concave mirror, which is disposed with respect to the fixing groove and guides light emitted from one of either the optical fiber that is fixed to the fixing groove and the corresponding optical semiconductor element to the other, and a second alignment portion, which is formed on the second surface; and (3) the optical fiber, fixed to the fixing groove; and wherein (4) of the first alignment portion and the second alignment portion, one of either comprises a guide rail and the other comprises a guide groove that fit with the guide rail, and the sub-mount and the fiber fixing member are aligned and fixed by fitting together of the first alignment portion and the second alignment portion.

With the above-described optical module, the optical semiconductor element and the optical fiber are aligned by the fitting together of the first alignment portion of the sub-mount and the second alignment portion of the fiber fixing member. Alignment by passive alignment is thus enabled with this optical module.

Also, since the guide rail and the guide groove are used as the alignment portions, the optical semiconductor element and the optical fiber can be aligned at high precision.

Also, the second surface of the fiber fixing member, onto which the optical fiber is fixed, is positioned to face the first surface of the sub-mount, on which the optical semiconductor element is disposed. The step of aligning and fixing the fiber fixing member, to which the optical fiber is fixed, with respect to the sub-mount can thereby be performed after a step of die-bonding or wire-bonding, etc., the sub-mount to a circuit substrate. An optical module can thus be realized with which the handling and automation in the step of die-bonding or wire-bonding, etc., the sub-mount to the circuit substrate will not be hindered and with which mass production and cost reduction are enabled. Also, since the optical fiber is positioned parallel to the first surface of the sub-mount, the module height is kept low.

Furthermore, a concave mirror is disposed as a light guiding optical system between the optical fiber and the optical semiconductor element. Since the light that is emitted from one of either of the optical fiber and the optical semiconductor element is thereby converged and guided to the other, a high optical coupling factor can be realized.

The optical module may have an arrangement wherein the sub-mount has N (N being an integer no less than 2) of the optical semiconductor elements, the fiber fixing member has N of the fixing grooves that are mutually parallel and N of the concave mirrors, disposed, respectively, with respect to the N fixing grooves, and N of the optical fibers are, respectively, fixed in the N fixing grooves. In this case, since a plurality of optical signals can be transmitted in parallel, an optical module enabling transmission of higher speed and greater volume is provided.

Also, the optical semiconductor element may be prepared from the same material and by the same semiconductor process as the sub-mount and thereby formed to be monolithic with the first alignment portion. Or, the sub-mount may have an aligning mark formed by the same mask process as the first alignment portion and the optical semiconductor element may be disposed by being aligned with respect to the sub-mount using the aligning mark as a reference. In these cases, a sub-mount, with which the optical semiconductor element and the first alignment portion are aligned at high precision with respect to each other, can be obtained.

Also, the fiber fixing member may be molded integrally from resin. In this case, a fiber fixing member, with which the fixing groove, the concave mirror, and the second alignment portion are aligned at high precision with respect to each other, can be obtained.

Also, the second alignment portion may be formed substantially parallel to the fixing groove. In this case, the second alignment portion and the fixing groove can be formed readily while being aligned with respect to each other.

Also, the cross-sectional shape of the guide rail in the plane perpendicular to the longitudinal direction thereof may be a tapered shape. In this case, the fitting together of the guide rail and the guide groove is facilitated.

Also, the optical module may be equipped with a lens, which is disposed between the optical semiconductor element and the concave mirror and converge the light emitted from one of either the optical fiber and the corresponding optical semiconductor element to the other. In this case, the optical coupling factor can be improved further in accompaniment with the convergence by the concave mirror.

Also, as the optical semiconductor element to be disposed on the sub-mount, a photodetecting element may be used. In this case, the optical module becomes an optical receiving module. Or, a light emitting element may be used as the optical semiconductor element. In this case, the optical module becomes an optical transmitting module.

BEST MODES FOR CARRYING OUT THE INVENTION

Preferred embodiments of the present invention's optical module shall now be described along with the drawings. In the description of the drawings, the same elements shall be provided with the same symbols and redundant description shall be omitted. The dimensional proportions of the drawings do not necessarily match those of the descriptions.

Figure 1:
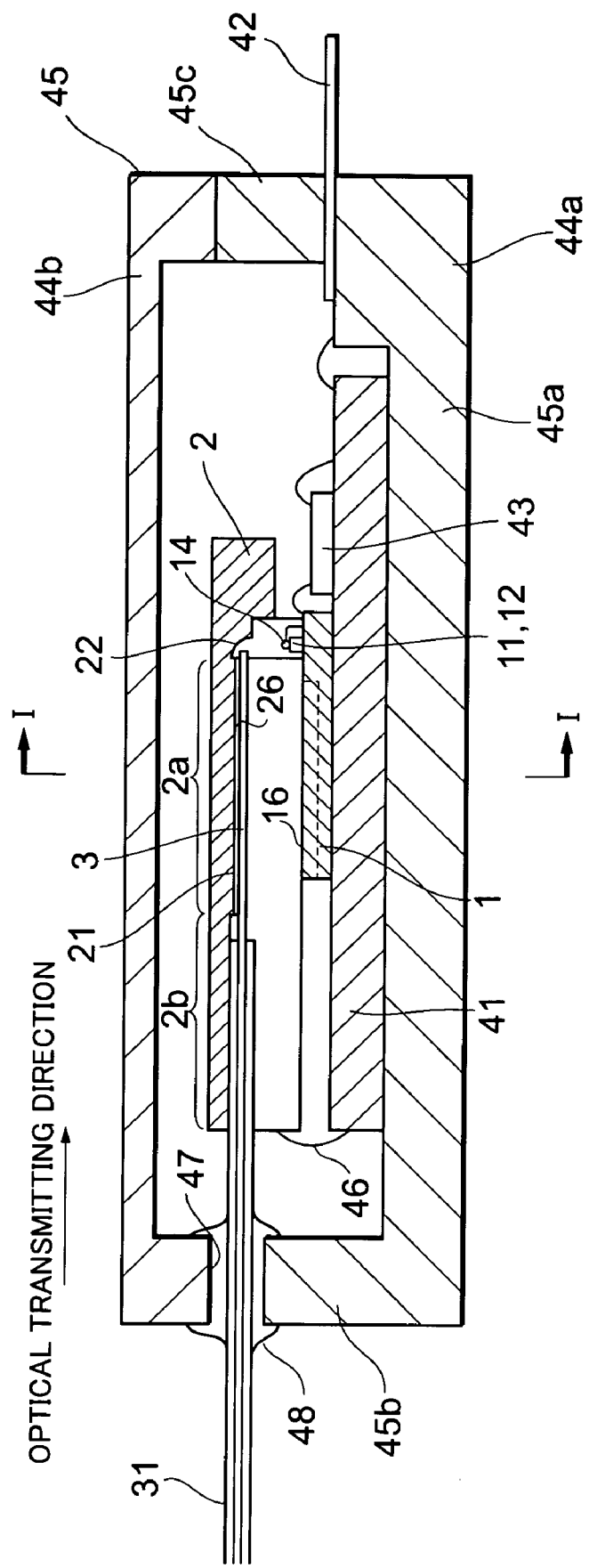
FIG. 1 is a sectional side view showing the arrangement of an embodiment of an optical module.

FIG. 1 is a sectional side view showing the arrangement of an embodiment of the present invention's optical module. The arrangement of this embodiment's optical module shall be described in outline using FIG. 1. This optical module is an optical module for optical transmission or optical receiving that transmits or receives optical signals in parallel and has N (where N is a natural number) optical fibers optically connected with N optical semiconductor elements. With the embodiment to be described below, N=4. Also, FIG. 1 shows the cross-sectional view in the plane containing the optical axes of one set among four sets of the optical fiber and the optical semiconductor element. In FIG. 1, the left-to-right direction is the direction of optical transmission along the optical axis of the optical fiber.

The present optical module is equipped with a circuit substrate 41, a sub-mount 1, a fiber fixing member 2, and a coated optical fiber array 31. The circuit substrate 41 is a mounting substrate on which sub-mount 1 is mounted. Wirings, electronic circuits, etc., necessary for signal processing are also mounted on the circuit substrate 41. In FIG. 1, a pre-amplifier 43, which amplifies and outputs an electrical signal, is mounted on the circuit substrate 41.

The sub-mount 1 is a substrate for installing the optical semiconductor element. This sub-mount 1 is set on the circuit substrate 41. The surface of the sub-mount 1 at the side opposite the side of the circuit substrate 41 is an optical element mounting surface (first surface) 16 on which the optical semiconductor element is disposed. For example, a silicon substrate may be used as the substrate of the sub-mount 1.

A photodiode array 11 is disposed on the optical element mounting surface 16. This photodiode array 11 is an optical semiconductor element array, with which four photodiodes (photodetecting elements) 12 are arrayed at a fixed pitch as the optical semiconductor elements. These photodiodes 12 are disposed with a direction perpendicular to the optical axes of the optical fibers 3 to be described later (the direction perpendicular to the paper surface in FIG. 1) as the array direction. The pre-amp 43 on the circuit substrate 41, the photodiode array 11 on the sub-mount 1, and the electrodes, wirings, etc., disposed on the circuit substrate 41 and sub-mount 1 are electrically connected by die-bonding or wire-bonding, etc.

The fiber fixing member 2 is a member that fixes the optical fibers. With respect to the sub-mount 1, this fiber fixing member 2 is installed at the side opposite the side of the circuit substrate 41. The surface of the fiber fixing member 2 that faces the optical element mounting surface 16 of the sub-mount 1 is an optical fiber fixing surface (second surface) 26 to which the optical fibers are fixed. The fiber fixing member 2 may, for example, be molded integrally from resin.

On the optical fiber fixing surface 26, four V-grooves 21 are formed in parallel as fixing grooves for aligning and fixing the optical fibers. The coated optical fiber array 31, having four optical fibers arrayed at a fixed pitch, is installed with respect to the V-grooves 21. The coating is removed across a predetermined length at a front end portion of the coated optical fiber array 31, thereby exposing four optical fibers 3. These exposed optical fibers 3 are aligned and fixed, respectively, in the corresponding V-grooves 21.

These V-grooves 21 and optical fibers 3 that are fixed to the V-grooves 21 are arrayed in a direction perpendicular to the optical axes of the optical fibers 3 and are positioned at the same pitch as the photodiodes 12 so as to correspond thereto. Also, along with an optical fiber fixing portion 2a, which is positioned above the sub-mount 1 and is provided with the V-grooves 21, the fiber fixing member 2 is provided with an array housing portion 2b, which protrudes in the direction in which the coated optical fiber array 31 extends from the sub-mount 1 and the optical fiber fixing portion 2a.

Also, on the optical fiber fixing surface 26, concave mirrors 22 are disposed at positions on the optical axes and opposing the end faces, respectively, of the optical fibers 3. These concave mirrors 22 are provided, respectively, for the four V-grooves 21 and optical fibers 3. The concave mirrors 22 are also positioned on the upwardly directed optical axes of the corresponding photodiodes 12 as viewed from the sub-mount 1. Each concave mirror 22 converts the optical path of the light emitted from the end face of an optical fiber 3 vertically downward by substantially 90°, converts the light to parallel light, and guides the light while converging it toward a photodiode 12.

Between the concave mirrors 22 and photodiodes 12, ball lenses 14 are aligned so that their optical axes are matched to the optical axes of the photodiodes 12. Each ball lens 14 converges the light, emitted from the optical fiber 3 and converted in the optical path by the concave mirror 22, onto the corresponding photodiode 12. With the present embodiment, a light guiding optical system between the optical fibers 3 and photodiodes 12 is arranged by the concave mirrors 22 and ball lenses 14. The ball lenses 14 can be aligned, for example, by fixing onto lens mounting pedestals formed using resist, etc., in the same semiconductor process as the photodiode array 11.

The above-mentioned circuit substrate 41, sub-mount 1, fiber fixing member 2, etc., are housed in a casing 45, comprising a casing body portion 44a, and a casing cover portion 44b positioned above the casing body portion 44a. On a bottom portion 45a of the casing body portion 44a, the circuit substrate 41 is disposed with the surface, at the side opposite the surface on which the sub-mount 1 is mounted, facing the bottom portion 45a.

An opening 47 is provided on the optical axes of the optical fibers 3 at a side portion 45b, which, among the side portions of the casing 45, is at the array housing portion 2b side as viewed from the optical fiber fixing portion 2a. The coated optical fiber array 31 is passed through this opening 47.

The opening 47, through which the coated optical fiber array 31 is passed, is filled with a solder 48. This solder 48 fixes the coated optical fiber array 31 to the casing 45 and closes the opening 47 and thereby keeps the casing 45 airtight. When the coated optical fiber array 31 is fixed by the solder 48 in this manner, the use of a metal coating, such as that of a metallized fiber, is preferable as the coating of the coated optical fiber array 31. Or, the coated optical fiber array 31 may be fixed to the casing 45 by a resin, etc.

At a side portion 45c of the casing 45 that opposes the side portion 45b is inserted output terminals 42. These output terminals 42 guide, to the exterior of the casing, the electrical signals from the photodiodes 12 that have been amplified by the pre-amps 43.

Figure 2:
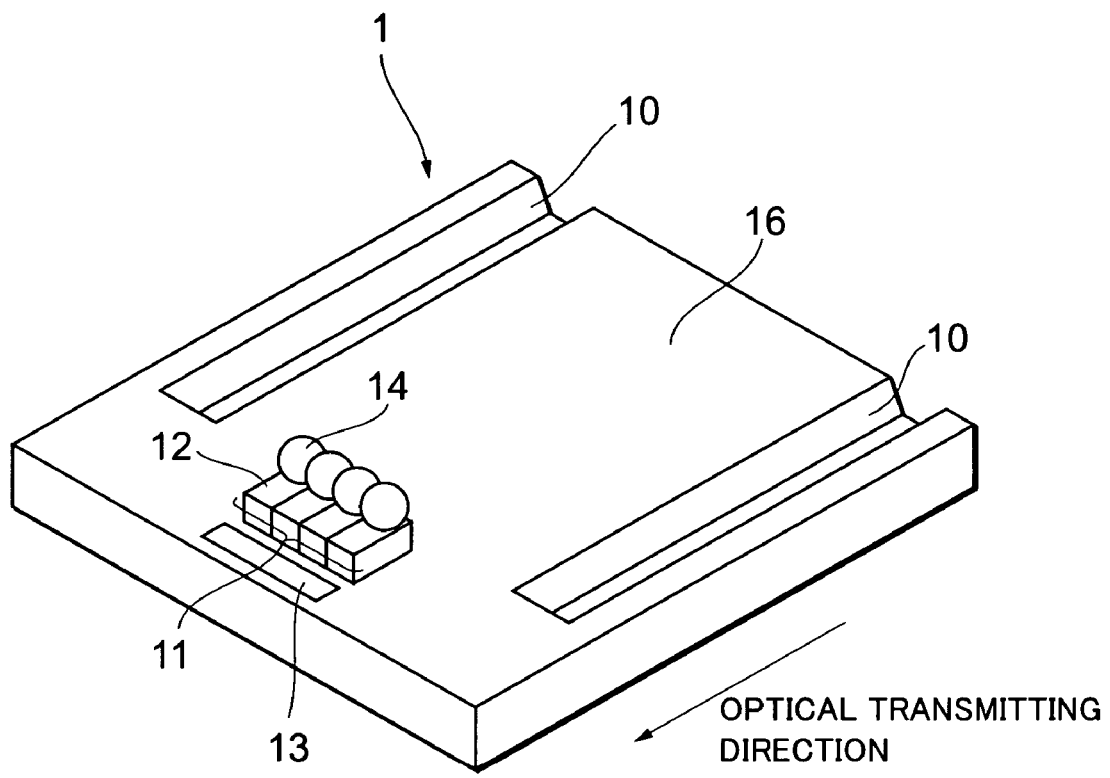
FIG. 2 is a perspective view of a sub-mount equipped in the optical module shown in FIG. 1.

FIG. 2 is a perspective view of the sub-mount 1 as viewed from the side of the fiber fixing member 2. The arrangement of the sub-mount 1 shall now be described in detail using FIG. 2.

On the optical element mounting surface 16 of the sub-mount 1, two guide grooves 10, which extend in parallel to each other, are formed as first alignment portions. The guide grooves 10 are for aligning the optical fibers 3 and photodiodes 12 by passive alignment. The direction in which these guide grooves 10 are formed is perpendicular to the array direction of the photodiodes 12. Also, the guide grooves 10 are disposed at predetermined positions corresponding to second alignment portions equipped on the fiber fixing member 2. The cross-sectional shape in the plane perpendicular to the longitudinal direction of each guide groove 10 is a tapered shape that becomes gradually narrow in width from the optical element mounting surface 16 toward the inner side of the sub-mount 1.

Also, on the optical element mounting surface 16 is formed an aligning mark 13. This aligning mark 13 serves as a reference in aligning and fixing the photodiode array 11 with respect to the sub-mount 1. The aligning mark 13 is aligned with respect to the two guide grooves 10 and is preferably formed by the same mask process as the guide grooves 10.

With respect to aligning mark 13, the photodiode array 11 is installed at a position at the upstream side in the optical transmittinbg direction of the optical fibers 3. The photodiode array 11 can be fixed to the sub-mount 1, for example, by flip-chip bonding. The Guide grooves 10, which are the first alignment portions, are aligned with respect to the photodiode array 11.

Figure 3:
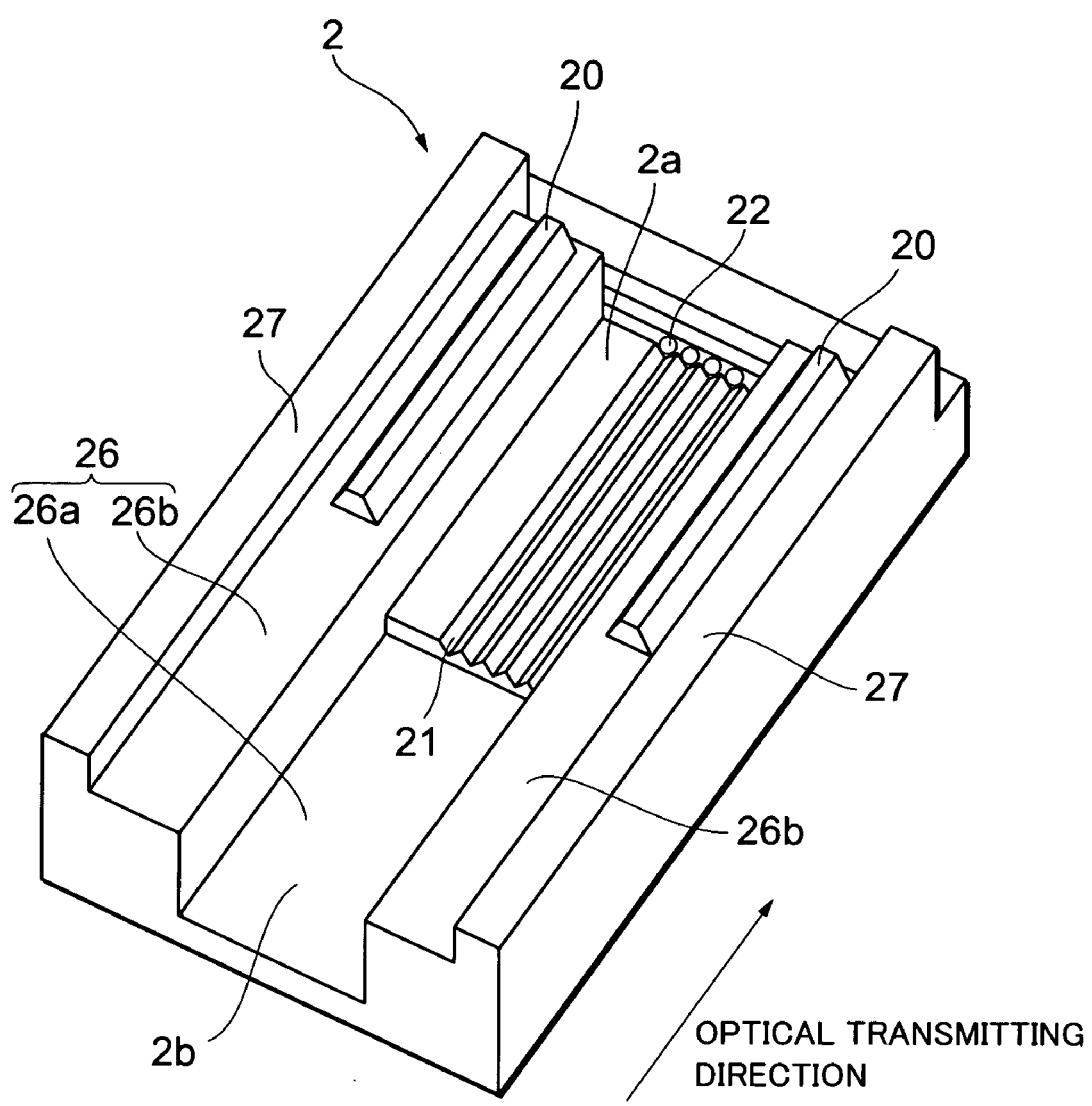
FIG. 3 is a perspective view of a fiber fixing member equipped in the optical module of FIG. 1.

FIG. 3 is a perspective view of the fiber fixing member 2 as viewed form the sub-mount 1 side. The arrangement of the fiber fixing member 2 shall now be described in detail using FIG. 3.

On the optical fiber fixing surface 26 of the fiber fixing member 2, two guide rails 20, which extend in parallel to each other, are formed as second alignment portions. The guide rails 20 are fitted with the guide grooves 10 to align the optical fibers 3 and photodiodes 12 by passive alignment. As with the guide grooves 10, the cross-sectional shape in the plane perpendicular to the longitudinal direction of each guide rail 20 is a tapered shape that becomes gradually narrow in width from the optical fiber fixing surface 26 toward the sub-mount 1 side. The direction in which the guide rails 20 are formed is parallel to the direction in which the V-grooves 21 are formed.

The optical fiber fixing surface 26 is formed so that as viewed in the array direction of the optical fibers 3, which is a direction perpendicular to the optical transmitting direction, the central portion is depressed along the optical transmitting direction. This depressed portion is a V-groove forming portion 26a at which the V-grooves 21 for fixing the optical fibers 3 are formed. By this arrangement, the distances between the optical fibers 3 and concave mirrors 22, which are installed on the optical fiber fixing surface 26, and the photodiodes 12, which are installed on the optical element mounting surface 16 of the sub-mount 1, are set favorably.

With the present embodiment, the upstream side portion in the optical transmitting direction of the V-groove forming portion 26a is the array housing portion 2b, and the downstream side portion is the optical fiber fixing portion 2a. As described using FIG. 1, four V-grooves 21, extending along the optical transmitting direction, are formed in the optical fiber fixing portion 2a, and four concave mirrors 22 are disposed further at the downstream side.

As viewed in the direction in which the optical fibers 3 are arrayed, the respective sides of the V-groove forming portion 26a are guide rail forming portions 26b. The two above-mentioned guide rails 20 are disposed, respectively, at the guide rail forming portions 26b at the respective sides so as to sandwich the four V-grooves 21 formed at the V-groove forming portion 26a. The guide rails 20, which are the second alignment portions, are aligned with respect to the V-grooves 21, and the optical fibers 3 fixed to the V-grooves 21. With the inclusion of the V-groove forming portion 26a and guide rail forming portions 26b, the width of the optical fiber fixing surface 26 in the array direction of the optical fibers 3 is substantially matched to the width of the sub-mount 1.

At the respective sides of the optical fiber fixing surface 26 at the outer sides of guide rail forming portions 26b as viewed in the array direction of the optical fibers 3 are provided with the guide portions 27. These guide portions 27 protrude toward the side at which the sub-mount 1 is positioned as viewed from the optical fiber fixing surface 26 and are the portions that guide the fitting of the guide rails 20 with the guide grooves 10 in the process of aligning and fixing the fiber fixing member 2 with respect to the sub-mount 1. The height of protrusion of these guide portions 27 is set smaller than the height of the sub-mount 1.

Figure 4:
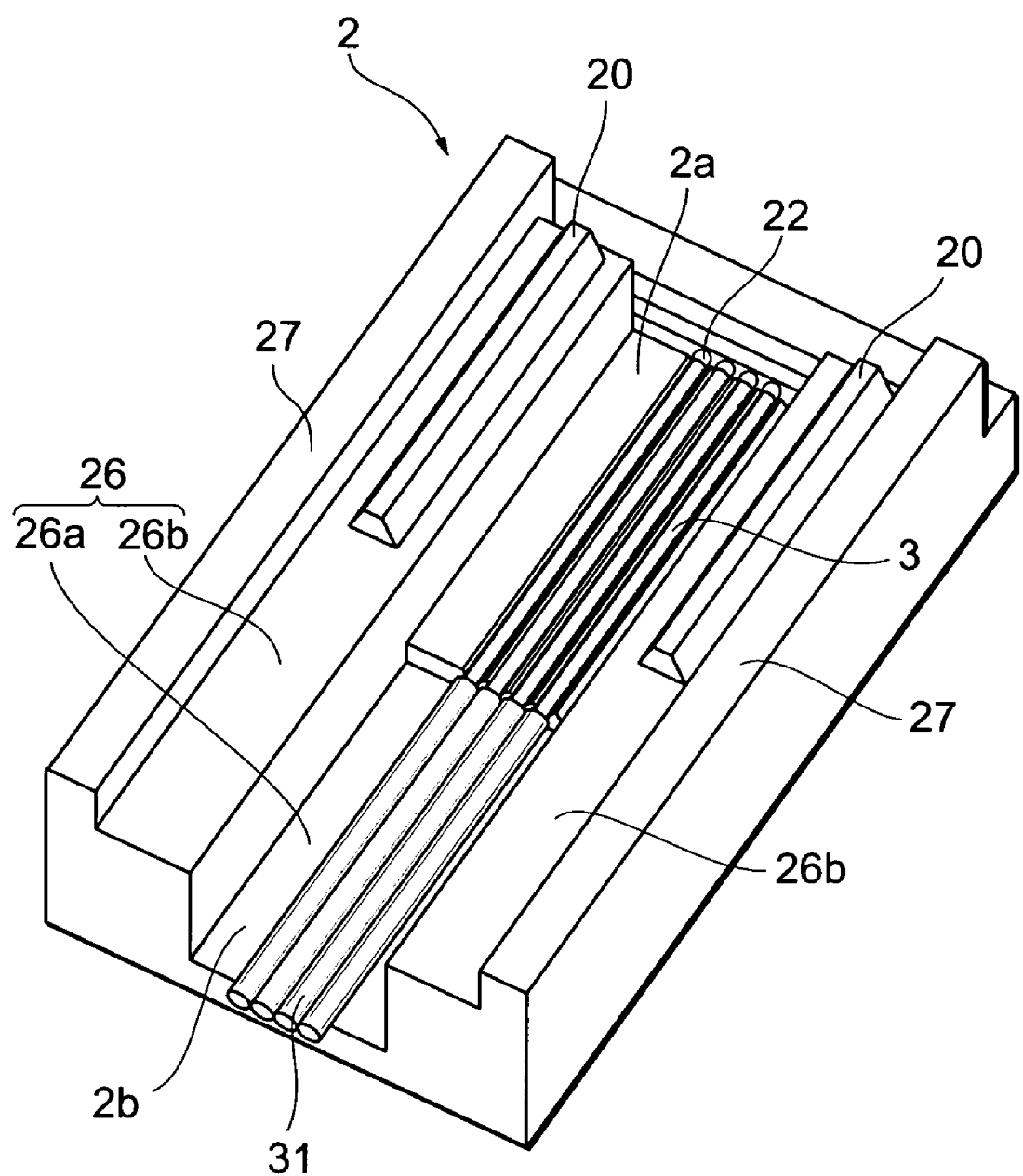
FIG. 4 is a perspective view showing the state wherein optical fibers are fixed to the fiber fixing member shown in FIG. 3.

FIG. 4 is a perspective view showing the state wherein the coated optical fiber array 31 and optical fibers 3 are fixed to the fiber fixing member 2 shown in FIG. 3. As shown in FIG. 4, the optical fibers 3 are fixed, respectively, to the four V-grooves 21. This fixing is carried out by placing the optical fibers 3 in the V-grooves 21 and adhesively fixing by an adhesive agent. In the process of fixing, a glass plate, etc., may be used as a fiber holder.

Figure 5:
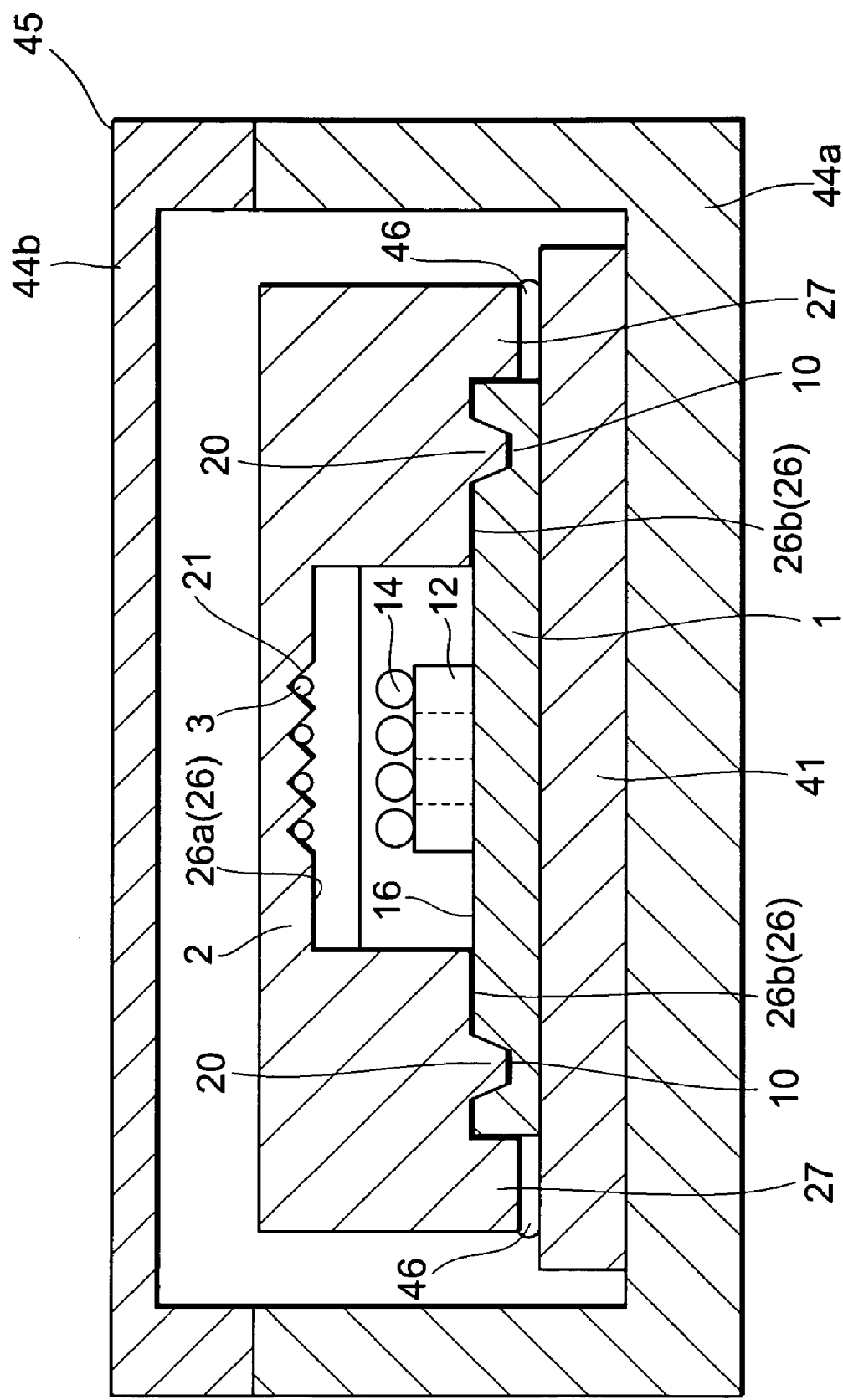
FIG. 5 is a sectional front view taken on line I—I of the optical module shown in FIG. 1.

FIG. 5 is a sectional front view taken on line I—I of the optical module shown in FIG. 1. The fiber fixing member 2 is set so that its guide portions 27 sandwich the sub-mount 1 from both sides and guide rail forming portions 26b of the optical fiber fixing surface 26 of the fiber fixing member 2 contacts the optical element mounting surface 16 of the sub-mount 1. At that point, as shown in FIG. 5, the guide grooves 10, formed in the sub-mount 1 and guide rails 20, formed on the fiber fixing member 2, fit together. The photodiodes 12, which are aligned with respect to the guide grooves 10, and optical fibers 3, which are aligned with respect to the guide rails 20, are thereby aligned by passive alignment.

The fiber fixing member 2 and circuit substrate 41, below the sub-mount 1, are fixed by an adhesive agent. In FIG. 5, an adhesive agent 46, which is filled between the lower surface of the guide portions 27 of the fiber fixing member 2 and the upper surface of the circuit substrate 41, is shown.

A process of assembling the present optical module shall now be described using FIG. 1. The circuit substrate 41 is mounted to the casing body portion 44a. The sub-mount 1 and pre-amps 43 are furthermore mounted to the circuit substrate 41. The mounting can be performed by die-bonding by a resin or wire-bonding by gold wires or aluminum wires, etc.

Meanwhile, as a separate process from the process of mounting the sub-mount 1, the optical fibers 3 are fixed to the fiber fixing member 2. By then fitting the guide rails 20 in the guide grooves 10, the fiber fixing member 2, to which the optical fibers 3 are fixed, is aligned and fixed with respect to the sub-mount 1. In this state, adhesive agent 46 is filled in the predetermined spaces to adhesively fix the fiber fixing member 2 to the circuit substrate 41.

Lastly, by passing the coated optical fiber array 31 through the opening 47 and sealingly fixing the casing cover portion 44b on the casing body portion 44a, the optical module is completed. This fixing in a sealing manner can be performed by adhesive fixing using a resin.

The effects of the optical module of the present embodiment shall now be described. With the present optical module, the optical fibers 3 and photodiodes 12 are aligned by the fitting together of the guide grooves 10 of the sub-mount 1 and guide rails 20 of the fiber fixing member 2. Alignment by passive alignment is thus realized with the present optical module.

Also, the guide grooves 10 are used as first alignment portions and guide rails 20 are used as second alignment portions. The optical fibers 3 and photodiodes 12 are thus aligned at high precision. Guide rails may be used instead as the first alignment portions formed on the sub-mount 1, and guide grooves may be used as the second alignment portions formed on the fiber fixing member 2.

Also, since the optical fiber fixing surface 26 is disposed so as to oppose the optical element mounting surface 16, the step of aligning and fixing the fiber fixing member 2, to which the optical fibers 3 are fixed, with respect to the sub-mount 1 can be performed after the step of die-bonding or wire-bonding, etc., the sub-mount 1 to the circuit substrate 41. Handling and automation of the step of die-bonding or wire-bonding, etc., the sub-mount 1 to the circuit substrate 41 will thus not be hindered. The present optical module thus enables mass production and cost reduction. Also, with the present optical module, since the optical fibers 3 are disposed parallel to the optical element mounting surface 16 of the sub-mount 1, the module height is kept low.

Furthermore, the concave mirrors 22 are provided as the light guiding optical system between the optical fibers 3 and photodiodes 12. Since light emitted from the optical fibers 3 are thereby converged and guided to the photodiodes 12, a high optical coupling factor is realized.

Also, with the present embodiment, the concave mirrors 22 make the light from the optical fibers 3 parallel light. Since the light from optical fibers 3 thus propagate as parallel light along the optical paths from the concave mirrors 22 to the ball lenses 14, the tolerance of the optical module is relaxed. For example, calculations using an optical simulator have shown that optical coupling is enabled even when the positional relationship between the concave mirrors 22 and photodiodes 12 is moved by approximately ±40 μm. The concave mirrors 22 are not necessarily limited to those that convert the reflected light into parallel light.

Also, with the present optical module, since pluralities of the optical fibers 3 and photodiodes 12 are provided, respectively, a plurality of optical signals can be transmitted in parallel. An optical module, enabling high-speed, high-volume transmission, is thus realized.

Also, the ball lenses 14 for converging light are disposed between the photodiodes 12 and concave mirrors 22. A high optical coupling factor is thus realized. However, in the case where an adequate optical coupling factor is obtained by just the convergence by the concave mirrors 22, the ball lenses 14 do not have to be provided. Such cases include the case where single mode fibers with a core diameter of 10 μm are used as the optical fibers 3 and the case where the photodiodes 12 that are used have an adequately large photodetecting diameter.

The ball lenses 14 can be aligned by fixing onto lens mounting pedestals formed using a resist, etc., in the same semiconductor process as that of the photodiode array 11. The ball lenses 14 can thereby be aligned at a precision of within ±1 to 2 μm in this case.

Also, in the case where the aligning mark 13 and guide grooves 10 are formed by the same mask process, the aligning mark 13 can be aligned at a precision of within ±1 to 2 μm with respect to the guide grooves 10. Thus, in this case, the photodiode array 11 and guide grooves 10 can be aligned at high precision with respect to each other.

The photodiode array 11 can be prepared from the same material and by the same semiconductor process as the sub-mount 1 and thereby formed to be monolithic to the guide grooves 10. The photodiode array 11 and guide grooves 10 are aligned at high precision with respect to each other when formed in this manner as well. In this case, the aligning mark 13 need not be formed as it is unnecessary.

In the case where the photodiode array 11 is mounted to the sub-mount 1 by flip-chip bonding, alignment can be performed at a precision of within ±5 μm.

Also, in the case where the fiber fixing member 2 is integrally molded from resin, it can be prepared at a high precision wherein the precision of the respective pitches of the V-grooves 21 and concave mirrors 22, the relative positional relationship of the V-grooves 21 and concave mirrors 22, and relative positional relationship of the guide rails 20 and V-grooves 21 are within 10 μm. The fiber fixing member 2 may also be molded integrally using an MIM (Metal Injection Mold). With this type of molding, the precision can be made as high as in the case of integral molding from resin.

Also, in the fiber fixing member 2, an adhesive agent having a refractive index matching characteristic can be filled between the optical fibers 3 and concave mirrors 22. The returning light from the front ends of the optical fibers 3 can thereby be restrained.

Also, the guide rails 20 are formed substantially parallel to the V-grooves 21. The guide rails 20 and V-grooves 21 can thus be aligned and formed readily. Furthermore, since the guide rails 20 are formed, respectively, on the guide rail forming portions 26b at the respective sides of the V-grooves 21, sub-mount 1 and the fiber fixing member 2 are aligned at high precision.

Also, the cross-sectional shapes in the plane perpendicular to the longitudinal direction of the guide grooves 10 and guide rails 20 are tapered shapes. The guide grooves 10 and guide rails 20 can thus be fitted together readily. Also, since the fiber fixing member 2 is provided with the guide portions 27, the fitting of the guide grooves 10 and guide rails 20 can be performed readily in a single step.

Optical modules, with which optical fibers and optical semiconductor elements are aligned by the fitting of guide rails and guide grooves, are also described in Japanese Patent Application Laid-Open No. H7-77634 and Japanese Patent Application Laid-Open No. H7-151940.

In Japanese Patent Application Laid-Open No. H7-77634 is described an optical module, wherein optical fibers and optical semiconductor elements are aligned by passive alignment by the fitting of guide rails, formed on a substrate to which the optical fibers are fixed, with guide grooves that are directly formed in the optical semiconductor elements.

However, this optical module has an arrangement wherein the optical fibers and the optical semiconductor elements are positioned along the same optical axis. Thus, portions for mounting the optical semiconductor elements must be provided on the substrate and along the optical axis in addition to the fixing portions for the optical fibers. This optical module thus cannot be made compact.

Meanwhile, the present invention's optical module has an arrangement wherein, the concave mirrors 22, which convert the optical paths of the light emitted from the optical fibers 3, are provided and the light from the optical fibers 3 are made incident on the photodiodes 12 at positions opposing the optical fiber fixing surface 26. There is thus no need to provide portions for mounting the photodiodes 12 on the fiber fixing member 2. The present optical module can thus be made compact.

Also, in Japanese Patent Application Laid-Open No. H7-151940 is described an optical module, wherein an alignment substrate is provided in addition to a fiber fixing member and a sub-mount.

However, with this optical module, an alignment portion must be formed not just on the fiber fixing member 2 and sub-mount but on the substrate as well. The step of forming the alignment portions and thus the process of manufacturing the entire optical module becomes complicated. Also, since there are two independent locations where alignment portions fit with each other (that is, the two locations for the fitting of the fiber fixing member with the substrate and the fitting of the sub-mount with the substrate), alignment errors will be amplified.

Meanwhile, with the present invention's optical module, alignment portions 10 and 20 are provided just at the sub-mount 1 and fiber fixing member 2 and these are fitted directly to perform alignment. Thus, with this optical module, the manufacturing process is simplified and alignment is carried out at high precision.

Figure 6:
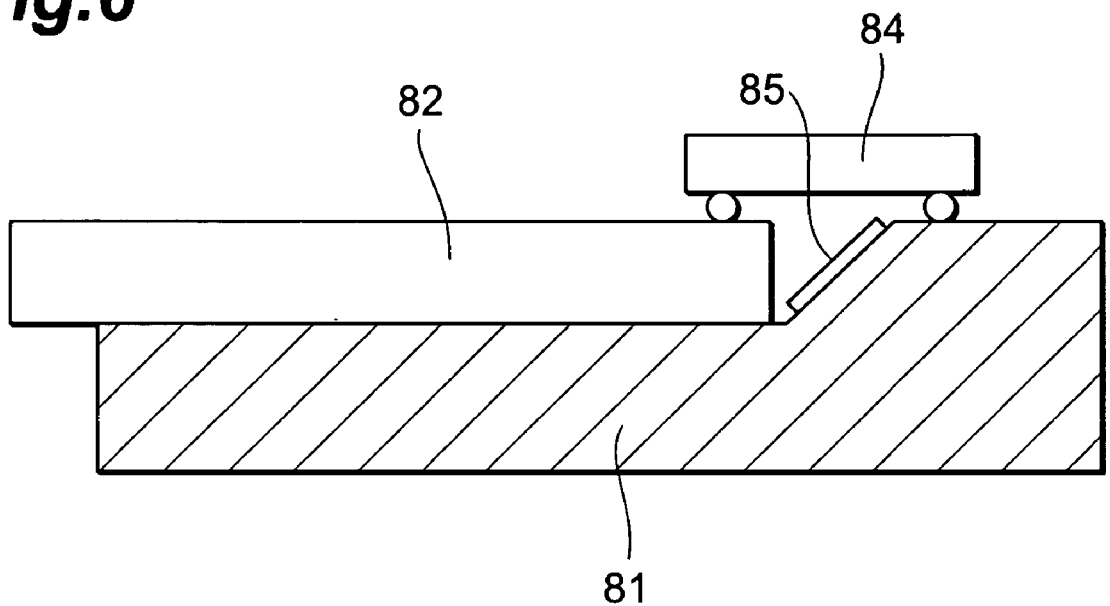
FIG. 6 is a sectional side view showing an arrangement example of a passive alignment type optical module.

Also, as a passive alignment type optical module, the arrangement shown in FIG. 6 may be considered for example. With the optical module of FIG. 6, the alignment of an optical fiber 82 and an optical semiconductor element 84 is carried out by means of a V-groove and an aligning mark that have been formed on a substrate 81 by the same mask process. A planar mirror 85, which guides light between the optical fiber 82 and optical semiconductor element 84 is provided on the substrate 81.

However, with this optical module, since the optical fiber 82 enters below the optical semiconductor element 84, the optical semiconductor element 84 is flip-chip mounted using the alignment mark as a guide after adhesively fixing the optical fiber 82 in the V-groove. Handling and automation in the step of flip-chip mounting the optical semiconductor element 84 are thus hindered. This optical module thus does not enable mass production and cost reduction.

Meanwhile, with the optical module of FIG. 1, the fiber fixing member 2, to which the optical fibers 3 have been fixed, can be aligned and fixed with respect to the sub-mount 1 after die-bonding or wire-bonding, etc., the sub-mount 1 to the circuit substrate 41. This optical module can thus be mass-produced and reduced in cost.

Also, with the optical module of FIG. 6, the rear surface (the surface at the side opposite the photodetecting surface) of the optical semiconductor element 84 is floated. Heat thus cannot be dissipated efficiently from the optical semiconductor element 84. This becomes a cause of unstable operation of the optical module, especially in the case of a VCSEL (Vertical Cavity Surface Emitting Laser) or other element of high heat generation amount.

Meanwhile, with the optical module of FIG. 1, since the photodiodes 12 are disposed on the sub-mount 1, the rear surfaces thereof are not floated. Heat can thus be dissipated efficiently from the photodiodes 12.

Figure 7:
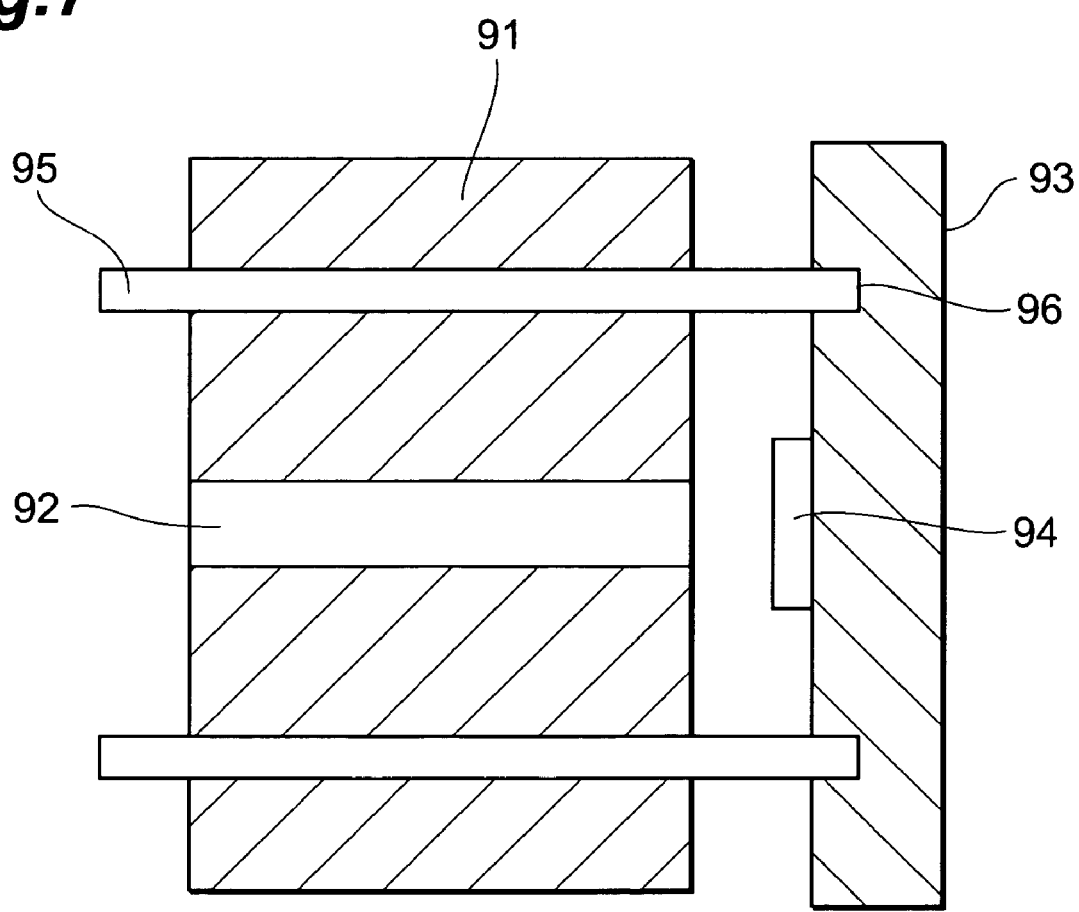
FIG. 7 is a sectional view showing an arrangement example of a conventional passive alignment type optical module.

Also, with an optical module, such as that shown in FIG. 6 or 7, the optical coupling factor is low since a concave mirror or other converging optical system is not used. That is, when high-speed operation of approximately 2.5 Gbps is considered, an element with a photodetecting diameter of 40 to 80 µm is normally used as the optical semiconductor element 84 or 94. Meanwhile, the distance along the optical axis from the optical fiber 82 or 92 to the optical semiconductor element 84 or 94 must be set to no less than the fiber cladding diameter (125 µm) in the case of the arrangement of FIG. 6 and no less than the loop height (approximately 100 µm) of the wires used in bonding in the case of the arrangement of FIG. 7. Consequently, the spot diameter on the optical semiconductor element 84 or 94 will be 117.5 µm in the case of a core diameter of 62.5 µm and a numerical aperture of 0.275 and will be 92 µm in the case of a core diameter of 50 µm, and thus the total light amount cannot be detected by the optical semiconductor element 84 or 94. The optical coupling factor will be lowered especially in the case where a multimode fiber of large core diameter and numerical aperture is used.

On the other hand, with the optical module of FIG. 1, since the light from the optical fibers 3 are converged and guided by the concave mirrors 22 to the photodiodes 12, a high optical coupling factor is realized.

An example of the optical design of the present invention's optical module shall now be described. Here, it shall be assumed that as each of the optical fibers 3, a multimode fiber with a core diameter of 62.5 µm and a numerical aperture of 0.275 is used, and as each of the photodiodes 12, a photodiode, having a photodetecting diameter of 80 µm and enabled to perform high-speed operation of up to 2.5 Gbps, is used. Also, the array pitch of the photodiodes 12 in the photodiode array 11 is 250 µm.

In this case, in order to prevent cross-talk, in which the light from one optical fiber 3 becomes incident on the photodetecting portions of two or more the photodiodes 12, the spreading of the light flux must be restrained to be no more than 200 µm in consideration of a margin. The upper limit of the interval between the optical fibers 3 and concave mirrors 22 is thus 250 µm.

Meanwhile, the interval between the concave mirrors 22 and photodiodes 12 must be set to no less than 250 µm in consideration of space for bonding wires, even if the ball lenses 14 are not to be provided. In addition, since the distance from the reflection centers of the concave mirrors 22 to the optical fibers 3 must also be considered, the interval between the concave mirrors 22 and photodiodes 12 must be set to no less than 312.5 µm. In the case where a glass plate, etc., is provided as an optical fiber holder, since the thickness thereof must be considered, the lower limit of the above-mentioned interval will be greater than 312.5 µm.

By the above, in the present invention's optical module, the interval between the concave mirrors 22 and photodiodes 12 will be greater than the interval between the optical fibers 3 and concave mirrors 22 and the optical system will be a magnifying system. Even with an arrangement wherein the latter interval is set to the upper limit of 250 µm and the former interval is set to the lower limit of 312.5 µm, the magnification will be 1.25 and the image of a core of 62.5 µm diameter will be an image of 78 µm diameter on a photodiode 12. Although the photodetecting diameter of each photodiode 12 is 80 µm, in consideration of the tolerances of the manufacture and assembly of the respective members 1 and 2, it will be difficult to realize an optical coupling factor of 100%.

Thus, with the present optical module, by providing a converging optical system of the concave mirrors 22, etc., the light from the optical fibers 3 are guided to the photodiodes 12 upon being converged. An optical coupling factor of 100% can thus be realized with this optical module.

Although in the optical module shown in FIG. 1 to FIG. 5, N, which expresses the number of the optical fibers 3, the number of the photodiodes 12, etc., is set to 4, this number N may be set as suited. When is N is set to 2 or more, since a plurality of optical signals can be transmitted in parallel as described above, transmission at higher speed and greater volume is enabled. Even when N is set to 1, the same effects as the optical module shown in FIG. 1 to FIG. 5 are exhibited in regard to the alignment of the optical fiber 3 and photodiode 12, etc.

Also, as the optical semiconductor element, a photodetecting element besides photodiode 12 may be used, or a light emitting element, such as a VCSEL, may be used. In the case where a light emitting element is used, the concave mirror 22 guides the light emitted from the light emitting element to the optical fiber 3 and the ball lens 14 converges the light emitted from the light emitting element.

INDUSTRIAL APPLICABILITY

The present invention's optical module can be used as an optical module suitable for mass production and cost reduction. That is, with the present invention's optical module, the optical fiber and the optical semiconductor element are aligned by the fitting together of the first alignment portion and the second alignment portion. Alignment of the optical fiber and optical semiconductor element by passive alignment is thus realized.

Also, since the guide rail and the guide groove are used as the alignment portions, the optical fiber and the optical semiconductor element are aligned at high precision.

Also, the step of aligning and fixing the fiber fixing member, to which the optical fiber is fixed, with respect to the sub-mount can be performed after the step of die-bonding or wire-bonding, etc., the sub-mount to the circuit substrate. An optical module that enables mass production and cost reduction is thus realized. Also, since the optical fiber is disposed in parallel to the first surface of the sub-mount, the module height is kept low.

Furthermore, the concave mirror is disposed as the light guiding optical system between the optical fiber and the optical semiconductor element. Since the light emitted from one of either of the optical fiber and the optical semiconductor element is thereby converged and guided to the other, a high optical coupling factor is realized.

The invention claimed is:

1. An optical module comprising:
   a sub-mount, having an optical semiconductor element, which is disposed on a predetermined first surface, and a first alignment portion, which is formed on the first surface;
   a fiber fixing member, having a fixing groove, which is formed on a predetermined second surface and is for aligning and fixing an optical fiber, a concave mirror, which is disposed with respect to the fixing groove and guides light emitted from one of either the optical fiber that is fixed to the fixing groove and the corresponding optical semiconductor element to the other, and a second alignment portion, which is formed on the second surface; and
   the optical fiber, fixed to the fixing groove; and
   wherein of the first alignment portion and the second alignment portion, one of either comprises a guide rail and the other comprises a guide groove that fit with the guide rail, and the sub-mount and the fiber fixing member are aligned and fixed by fitting together of the first alignment portion and second alignment portion, wherein the optical semiconductor element is prepared from the same material and by the same semiconductor process as the sub-mount and thereby formed to be monolithic with the first alignment portion.

2. The optical module according to claim 1 wherein the sub-mount has N (N being an integer no less than 2) of the optical semiconductor elements, the fiber fixing member has N of the fixing grooves that are mutually parallel and N of the concave mirrors, disposed, respectively, with respect to the N fixing grooves, and N of the optical fibers are, respectively, fixed in the N fixing grooves.

3. An optical module comprising:

a sub-mount, having an optical semiconductor element, which is disposed on a predetermined first surface, and a first alignment portion, which is formed on the first surface;

a fiber fixing member, having a fixing groove, which is formed on a predetermined second surface and is for aligning and fixing an optical fiber, a concave mirror, which is disposed with respect to the fixing groove and guides light emitted from one of either the optical fiber that is fixed to the fixing groove and the corresponding optical semiconductor element to the other, and a second alignment portion, which is formed on the second surface; and the optical fiber, fixed to the fixing groove; and wherein of the first alignment portion and the second alignment portion, one of either comprises a guide rail and the other comprises a guide groove that fit with the guide rail, and the sub-mount and the fiber fixing member are aligned and fixed by fitting together of the first alignment portion and second alignment portion, wherein the sub-mount has an aligning mark formed by the same mask process as the first alignment portion and the optical semiconductor element is disposed by being aligned with respect to the sub-mount using the aligning mark as a reference.

4. The optical module according to claim 1, wherein the fiber fixing member is molded integrally from resin.

5. The optical module according to claim 1, wherein the second alignment portion is formed substantially parallel to the fixing groove.

6. The optical module according to claim 1, wherein the cross-sectional shape of the guide rail in the plane perpendicular to the longitudinal direction thereof is a tapered shape.

7. An optical module comprising:

a sub-mount, having an optical semiconductor element, which is disposed on a predetermined first surface, and a first alignment portion, which is formed on the first surface;

a fiber fixing member, having a fixing groove, which is formed on a predetermined second surface and is for aligning and fixing an optical fiber, a concave mirror, which is disposed with respect to the fixing groove and guides light emitted from one of either the optical fiber that is fixed to the fixing groove and the corresponding optical semiconductor element to the other, and a second alignment portion, which is formed on the second surface; and the optical fiber, fixed to the fixing groove; and wherein of the first alignment portion and the second alignment portion, one of either comprises a guide rail and the other comprises a guide groove that fit with the guide rail, and the sub-mount and the fiber fixing member are aligned and fixed by fitting together of the first alignment portion and second alignment portion, further comprising a lens, which is disposed between the optical semiconductor element and concave mirror and converge the light emitted from one of either the optical fiber and the corresponding optical semiconductor element to the other.

8. The optical module according to claim 1, wherein the optical semiconductor element is a photodetecting element.

9. The optical module according to claim 1, wherein the optical semiconductor element is a light emitting element.

10. The optical module according to claim 3, wherein the sub-mount has N (N being an integer no less than 2) of the optical semiconductor elements, the fiber fixing member has N of the fixing grooves that are mutually parallel and N of the concave mirrors, disposed, respectively, with respect to the N fixing grooves, and N of the optical fibers are, respectively, fixed in the N fixing grooves.

11. The optical module according to claim 3, wherein the fiber fixing member is molded integrally from resin.

12. The optical module according to claim 3, wherein the second alignment portion is formed substantially parallel to the fixing groove.

13. The optical module according to claim 3, wherein the cross-sectional shape of the guide rail in the plane perpendicular to the longitudinal direction thereof is a tapered shape.

14. The optical module according to claim 3, wherein the optical semiconductor element is a photodetecting element.

15. The optical module according to claim 3, wherein the optical semiconductor element is a light emitting element.

16. The optical module according to claim 7, wherein the sub-mount has N (N being an integer no less than 2) of the optical semiconductor elements, the fiber fixing member has N of the fixing grooves that are mutually parallel and N of the concave mirrors, disposed, respectively, with respect to the N fixing grooves, and N of the optical fibers are, respectively, fixed in the N fixing grooves.

17. The optical module according to claim 7, wherein the fiber fixing member is molded integrally from resin.

18. The optical module according to claim 7, wherein the second alignment portion is formed substantially parallel to the fixing groove.

19. The optical module according to claim 7, wherein the cross-sectional shape of the guide rail in the plane perpendicular to the longitudinal direction thereof is a tapered shape.

20. The optical module according to claim 7, wherein the optical semiconductor element is a photodetecting element.

21. The optical module according to claim 7, wherein the optical semiconductor element is a light emitting element.

* * * * *